United States Patent
Srinivas et al.

(10) Patent No.: US 7,825,838 B1
(45) Date of Patent: Nov. 2, 2010

(54) CAPACITOR ROTATION METHOD FOR REMOVING GAIN ERROR IN SIGMA-DELTA ANALOG-TO-DIGITAL CONVERTERS

(75) Inventors: Theertham Srinivas, Bangalore (IN); Vallamkonda Madhuri, Bangalore (IN); DVJ Ravi Kumar, Bangalore (IN); Gururaj Ghorpade, Bangalore (IN); Priyanka Khasnis, Bangalore (IN); Mehmet Aslan, Sunnyvale, CA (US); Richard Dean Henderson, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 55 days.

(21) Appl. No.: 12/399,804

(22) Filed: Mar. 6, 2009

Related U.S. Application Data

(60) Provisional application No. 61/094,733, filed on Sep. 5, 2008.

(51) Int. Cl.
  H03M 1/10 (2006.01)
(52) U.S. Cl. ...................... 341/121; 341/120
(58) Field of Classification Search .......... 341/120–155
  See application file for complete search history.

(56) References Cited

U.S. PATENT DOCUMENTS

| | | | |
|---|---|---|---|
| 5,305,004 A | 4/1994 | Fattaruso | |
| 5,638,071 A * | 6/1997 | Capofreddi et al. | 341/118 |
| 5,925,921 A | 7/1999 | Susak | |
| 6,198,423 B1 | 3/2001 | Yu | |
| 6,222,471 B1 | 4/2001 | Nagaraj | |
| 6,229,467 B1 * | 5/2001 | Eklund et al. | 341/120 |
| 6,697,003 B1 | 2/2004 | Chen | |
| 6,891,486 B1 | 5/2005 | Pentakota et al. | |
| 6,897,673 B2 | 5/2005 | Savage et al. | |
| 7,002,504 B2 | 2/2006 | McMahill | |
| 7,038,603 B2 * | 5/2006 | Diorio et al. | 341/133 |
| 7,170,439 B1 | 1/2007 | Chen | |
| 7,741,982 B2 * | 6/2010 | Johansson et al. | 341/118 |
| 2004/0183560 A1 | 9/2004 | Savage et al. | |
| 2005/0116847 A1 | 6/2005 | Pentakota et al. | |

OTHER PUBLICATIONS

Trevor C. Caldwell et al., "An Incremental Data Converter with an Oversampling Ratio of 3," © 2006 IEEE, pp. 125-128.

* cited by examiner

*Primary Examiner*—Lam T Mai
(74) *Attorney, Agent, or Firm*—Patent Law Group LLP; Carmean C. Cook

(57) ABSTRACT

A method for removing component mismatch errors for a system parameter being set by a ratio of two or more physical, electrical components ("components") of the same kind on an integrated circuit including providing an array of component units having the same component value, determining the actual component values of each component unit in the array, selecting component units based on the actual component values to form pairs of component units where the pairs have approximately the same total component values, ordering the component unit pairs, assigning alternate component unit pairs to be associated with each of the two or more components, rotating at a first frequency the assignment of the component unit pairs. At each rotation, the component unit pairs to be associated with each component are shifted so that each component unit pair is associated with a different one of the two or more components in turn.

24 Claims, 11 Drawing Sheets

Linear gradient with 0.5% systematic mismatch

Annula gradient with 0.5% systematic mismatch

| Rotation Clock Cycle | Order of Capacitor Pairs<br>12 11 10 9 8 7 6 5 4 3 2 1 |
|---|---|
| 1 | 1,0,1,0,1,0,1,0,0,0,0,0 |
| 2 | 0,1,0,1,0,1,0,0,0,0,0,1 |
| 3 | 1,0,1,0,1,0,0,0,0,0,1,0 |
| 4 | 0,1,0,1,0,0,0,0,0,1,0,1 |
| 5 | 1,0,1,0,0,0,0,0,1,0,1,0 |
| 6 | 0,1,0,0,0,0,0,1,0,1,0,1 |
| 7 | 1,0,0,0,0,0,1,0,1,0,1,0 |
| 8 | 0,0,0,0,0,1,0,1,0,1,0,1 |
| 9 | 0,0,0,0,1,0,1,0,1,0,1,0 |
| 10 | 0,0,0,1,0,1,0,1,0,1,0,0 |
| 11 | 0,0,1,0,1,0,1,0,1,0,0,0 |
| 12 | 0,1,0,1,0,1,0,1,0,0,0,0 |
| 13 | 1,0,1,0,1,0,1,0,0,0,0,0 |

Fig. 10

| Rotation Clock Cycle | Order of Capacitor Pairs<br>12 11 10 9 8 7 6 5 4 3 2 1 |
|---|---|
| 1 | 1,0,1,0,1,0,1,0,1,0,1,0 |
| 2 | 0,1,0,1,0,1,0,1,0,1,0,1 |
| 3 | 1,0,1,0,1,0,1,0,1,0,1,0 |

Fig. 11

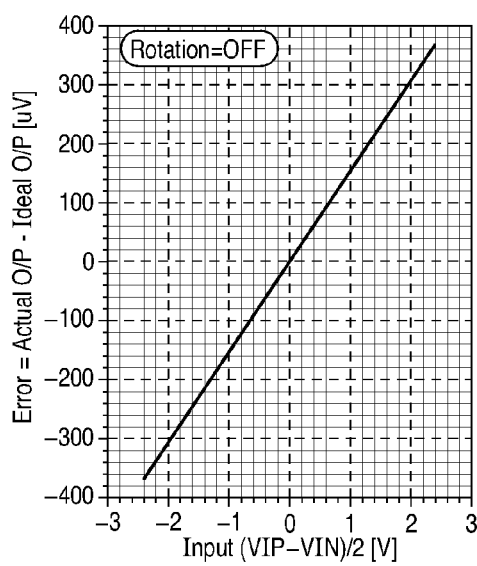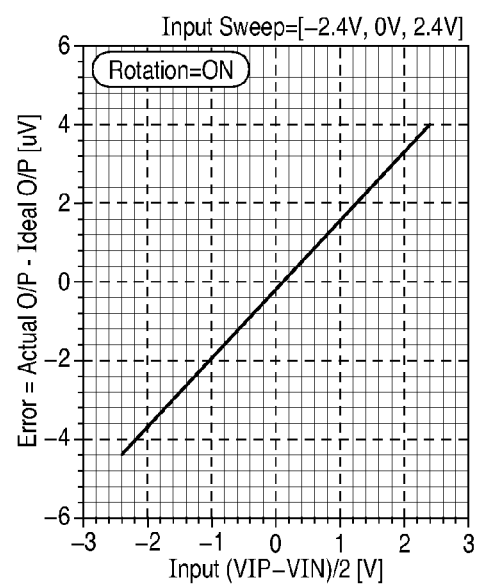
FIG. 14(a)  FIG. 14(b)

CAPACITOR ROTATION METHOD FOR REMOVING GAIN ERROR IN SIGMA-DELTA ANALOG-TO-DIGITAL CONVERTERS

CROSS-REFERENCE TO RELATED APPLICATION

This application claims the benefit of U.S. Provisional Patent Application Ser. No. 61/094,733, filed on Sep. 5, 2008, of Priyanka Khasnis et al., which application is incorporated herein by reference in its entirety.

This application is related to concurrently filed and commonly assigned U.S. patent application Ser. No. 12/399,797, entitled "Background Calibration Method For Analog-to-Digital Converters," of the same inventors hereof, which patent application is incorporated herein by reference in its entirety.

FIELD OF THE INVENTION

The invention relates to a method for removing component mismatch errors in an integrated circuit and, in particular, to a component rotation method where pairs of physical, electrical component units formed in an array are selected and rotatably connected for use as one or more components for reducing component mismatch errors.

DESCRIPTION OF THE RELATED ART

Analog-to-digital converters (ADCs) are used in converting or digitizing an analog input signal to generate a digital output signal indicative of the value of the analog input signal within a given conversion time. Analog-to-digital converters used in instrumentation and measurements often require high absolute accuracy, including very high linearity. The conventional sigma-delta ($\Sigma\Delta$) ADC topology used in telecommunication and audio applications usually cannot satisfy the requirements of high absolute accuracy and very small DC offset in instrumentation and measurement applications. The incremental (or integrating) converter provides a solution for such measurement applications, as it has most of the advantages of the $\Sigma\Delta$ converter, yet it is also capable of very low DC offset and accurate conversion. Still, most of the conventional data converters rely on matched analog components, such as capacitors and resistors, to achieve low gain error. Component mismatch errors in conventional ADCs result in gain errors which degrade the accuracy of the analog-to-digital conversion.

BRIEF DESCRIPTION OF THE DRAWINGS

FIG. 10 is a capacitor rotation table of twelve pairs of unitary capacitors being assigned for use with a sampling capacitor and a feedback capacitor for ADC gain=1.

FIG. 11 is a second capacitor rotation table of twelve pairs of unitary capacitors being assigned for use with a sampling capacitor and a feedback capacitor for ADC gain=2.

FIGS. 14(a) and 14(b) are simulation results of gain error of an ADC with and without the capacitor rotation method implemented for an assumed capacitor profile.

DETAILED DESCRIPTION OF THE PREFERRED EMBODIMENTS

According to the principles of the present invention, a component rotation method for removing component mismatch errors for a system parameter in an integrated circuit where the system parameter is set by a ratio of two or more physical, electrical components ("components") of the same kind on the integrated circuit is described. The component rotation method selects pairs of physical, electrical component units from an array and rotatably connects the pairs for use as one or more components for reducing component mismatch errors for the system parameter. By pairing of the component units to obtain the same total component values, variations in the actual component values of the component units are averaged out. By rotating the component unit pairs for use as one or more components in turn, systematic and random errors due to component mismatch are completely eliminated.

In the present description, the term "physical, electrical components" refers to electrical components that are physically formed on an integrated circuit. For example, physical, electrical components include resistors, inductors, capacitors that are formed on an integrated circuit using various layers of the semiconductor device structure, including diffusion regions, polysilicon layers, oxide layers and metal layers. In most applications, the electrical components such as resistors, inductors and capacitors are formed as unitary components or component units in a two dimensional array on the integrated circuit. A unitary component or a component unit is considered to have a unit component value, such as a unit resistance value, a unit inductance value or a unit capacitance value. A desired component value for a particular electrical component is derived by connecting one or more of the component units together.

In the present description, the term "system parameters" refer to a parameter of an electrical system defining the operational characteristic of the electrical system. For example, a system parameter can be the gain, a frequency or voltage divider ratio or other parameters. The component rotation method of the present invention is particularly applicable when the system parameter is a function of a ratio of two or more components of the same kind.

Figure 16:
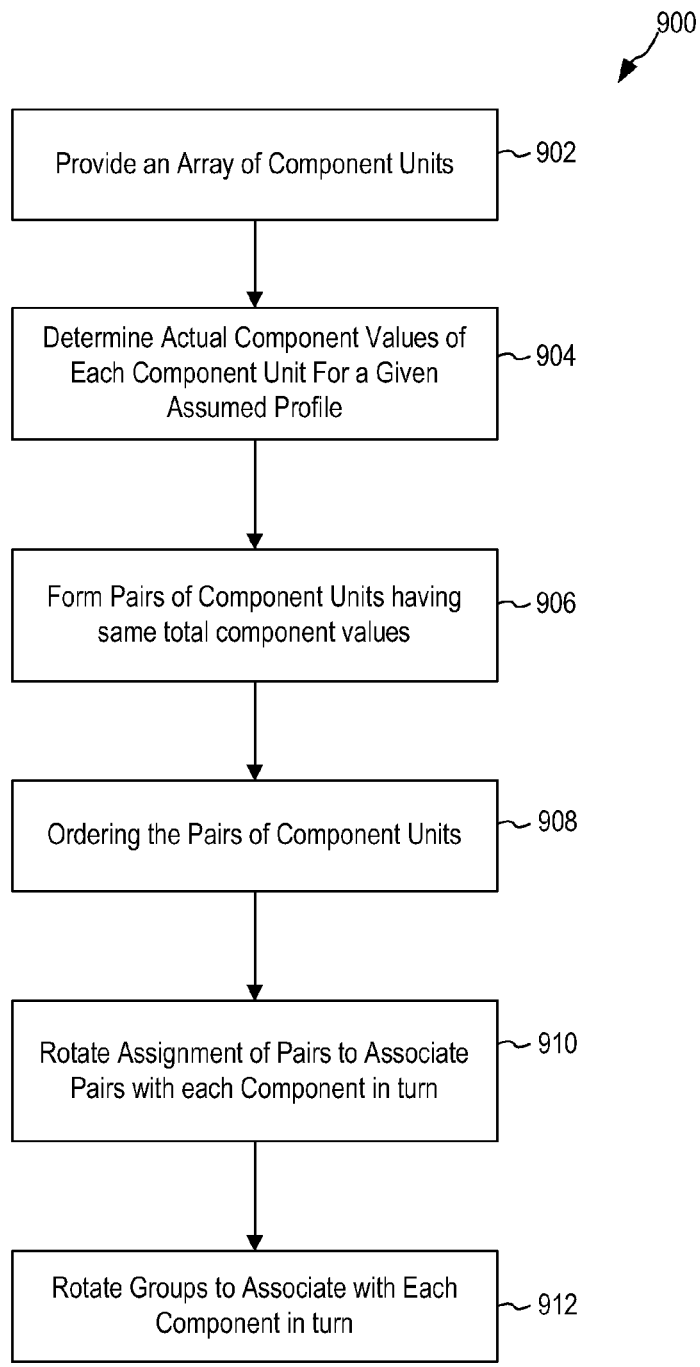
FIG. 16 is a flow chart illustrating the component rotation method according to one embodiment of the present invention.

FIG. 16 is a flow chart illustrating the component rotation method according to one embodiment of the present invention. In the embodiment shown in FIG. 16, the component rotation method 900 of the present invention involves providing an array of component units on the integrated circuit where each component unit is designed to have the same component value (step 902). The component rotation method 900 determines the actual component values of each component unit in the array, either by physical measurement or by modeling (step 904). In the present embodiment, the actual component values of each component unit are determined for a given assumed profile. Then, the component units are selected based on the actual component values to form pairs of component units ("component unit pairs") where the pairs have approximately the same total component values (step 906). The component unit pairs are ordered and alternate component unit pairs are assigned to be associated with each of the two or more components (step 908). Finally, the assignment of the component unit pairs to be associated with each of the two or more components are rotated at a first frequency (step 910). At each rotation, the component unit pairs to be associated with each component are shifted along the order of the component unit pairs so that each component unit pair is associated with a different one of the two or more physical, electrical components in turn so that the time-average of the system parameter results in a very low system parameter error (step 912).

In most cases, the component units are laid out in certain patterns in an array. In one embodiment, the actual component values of each component unit in the array are determined using modeling based on an assumed profile of the distribution of the actual component values in the array. The assumed profile can be a linear gradient or an annular gradient for a two-dimensional array.

In another embodiment, the pairs of component units are selected using min-max pairing. That is, a first pair of component units is formed using a component unit having the lowest actual component value and a component unit having the largest actual component value, and the next pair of component units is formed using a component unit with the next lowest actual component value and a component unit with the next largest actual component value and so on.

In another embodiment, a first number of alternate component unit pairs are assigned to a first component and a second number of component unit pairs are assigned to a second component. The second number of component unit pairs includes component unit pairs that are alternating with the first number of alternate component unit pairs and component unit pairs that are consecutive and the second number is greater than the first number.

The component unit pairs are rotated at a first frequency to associate each component unit pair with a different one of the two or more physical, electrical components in turn. In one embodiment, the first frequency is a frequency distant from a frequency being used by the integrated circuit in normal operation. For instance, in one embodiment, the first frequency is $$\frac{f_{CLK}}{\sqrt{OSR}}$$

where $f_{CLK}$ a frequency being used by the integrated circuit in normal operation and OSR is the over-sampling ratio of the integrated circuit. Furthermore in another embodiment, the first frequency is a frequency that is a square-root of a frequency being used by the integrated circuit in normal operation and rounded off to a square of two. The frequency being used by the integrated circuit in normal operation can be the sampling frequency of an analog-to-digital converter.

According to one aspect of the present invention, the component rotation method is applied to rotate the sampling and feedback capacitors in an incremental analog-to-digital converter (ADC). When the component rotation method is used to rotate capacitors on an integrated circuit, the component rotation method is also referred to as a "capacitor rotation method." In one embodiment, the capacitor rotation method is applied in an incremental ADC where capacitor pairs formed in an array are being rotated to function as the sampling capacitor $C_S$ and the feedback capacitor $C_f$ in turn. By rotating the capacitors being used for the sampling capacitor and the feedback capacitor in the incremental ADC, each capacitor is ensured to experience the same error in capacitance values and capacitor mismatch errors which can lead to gain error in the ADC are thereby reduced.

In one embodiment, the capacitor rotation method is implemented in an 18-bit incremental ADC with a data rate of 100 samples per second (SPS). The ADC includes an on-chip digital filter realized in a 0.35 μm/5V CMOS process. The ADC implements the capacitor rotation scheme of the present invention by rotating unitary capacitors in a capacitor array having a pre-defined layout with an assumed capacitance value distribution profile. By rotating the unitary capacitors used for the sampling capacitor and the feedback capacitor which determine the gain of the ADC, high gain accuracy can be achieved. In one embodiment, the absolute gain error of the ADC is measured using the capacitor rotation method and an absolute gain error value of less than 0.0008% is obtained, representing a marked improvement over conventional capacitor mismatch error removal techniques.

Gain Error Caused by Component Mismatch

Figure 1:
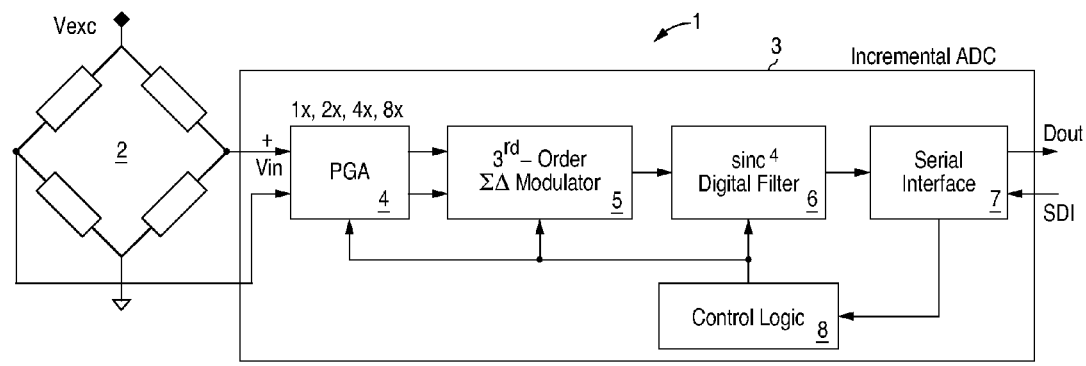
FIG. 1 is a block diagram of an exemplary smart sensor chip incorporating an incremental ADC to which the capacitor rotation method of the present invention can be applied.

FIG. 1 is a block diagram of an exemplary smart sensor chip incorporating an incremental ADC to which the capacitor rotation method of the present invention can be applied. Referring to FIG. 1, a smart sensor chip 1 includes a transducer 2 receiving an excitation voltage Vexc and generating a differential input voltage Vin, which is function of the parameter to be measured, e.g. pressure, temperature, etc. The differential input voltage Vin is provided to an incremental ADC 3 to digitizing the analog voltage signal Vin and providing a digital output signal Dout. In incremental ADC 3, the input voltage Vin is first provided to a programmable gain amplifier (PGA) 4 operating to amplify the input voltage Vin which usually has a weak amplitude. In the present illustration, PGA 4 has a switchable gain (1×, 2×, 4×, 8×) to accommodate different input signal levels. After the input voltage Vin is amplified, the input voltage Vin is digitized by a third-order low-distortion single-bit sigma-delta loop formed by a third-order sigma-delta (ΣΔ) modulator 5, a fourth order sinc digital filter 6. Digital filter 6 generates a 24-bit digital output (18 bits of data and 6 noise bits) indicative of the sampled input voltage Vin. The 24-bit digital output signal from filter 6 is coupled to a serial interface 7 to be serialized into a 1-bit digital data stream Dout. Incremental ADC 3 receives control signals on a serial data interface (SDI) and the control signals are provided to a control logic block 8 to control the operation of PGA 4, ΣΔ modulator 5, and digital filter 6.

In incremental ADC 3, mismatches between capacitor elements in the ΣΔ modulator create gain error. The capacitor rotation method of the present invention is implemented in incremental ADC 3 to remove gain error caused by capacitor mismatches by dynamically rearranging the interconnections of mismatched capacitors so that the time-average of the dynamic combination results in very low gain error.

Incremental ADC Architecture

Figure 2:
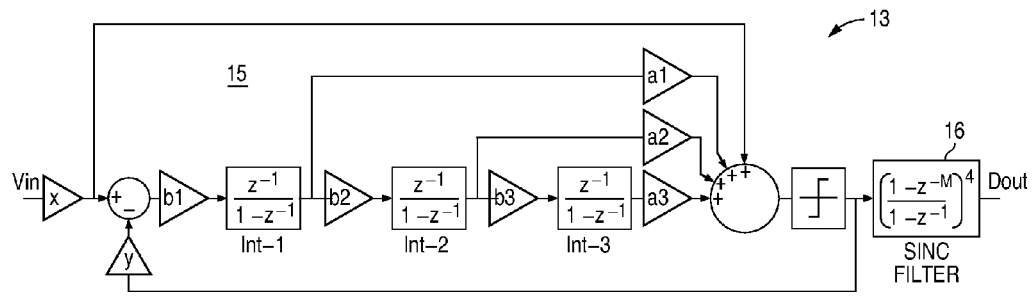
FIG. 2 is a block diagram illustrating the architecture of a $3^{rd}$ order incremental ADC according to one embodiment of the present invention.

FIG. 2 is a block diagram illustrating the architecture of a $3^{rd}$ order incremental ADC according to one embodiment of the present invention. Referring to FIG. 2, ADC 13 includes a discrete-time (switched-capacitor) sigma-delta (ΣΔ) modulator 15 and a fourth-order sinc filter (digital filter) 16. The ΣΔ modulator 15 uses a low-distortion cascaded-integrator/feed-forward (CIFF) modulator structure. In the CIFF modulator structure, the switched-capacitor integrators ideally do not carry the input signal, so that the required linearity of the operational amplifiers (op-amps) used to realize the switched capacitor integrators are reduced. In operation, the incremental ADC performs data conversion only for a limited number of clock cycles (e.g. 1024 clock cycles) and then the ADC is reset. The number of clock cycles is determined by two conditions: the first insures the required accuracy of the sigma-delta modulator output signal, and the second requires the filling of the registers of the sinc filter 16 with valid data. At the beginning of a new conversion, the integrators in the ΣΔ modulator 15 and the digital filter 16 are both reset.

The gain of the incremental ADC 13 in FIG. 2 is determined by the ratio of input coefficient (X) to the feedback coefficient (Y) as follows:

$$\text{Gain of the ADC } (G) = \frac{X}{Y}. \quad (1)$$

Assuming that the op-amps used to realize the switched-capacitor integrators and the feed forward path coefficients (a1, a2 and a3) of the input do not contribute significantly to the gain error, the error in the gain of the ADC, that is, the amount of deviation from the required or ideal gain value, mainly depends on the accuracy of the ratio of the coefficients (X and Y).

Figure 3:
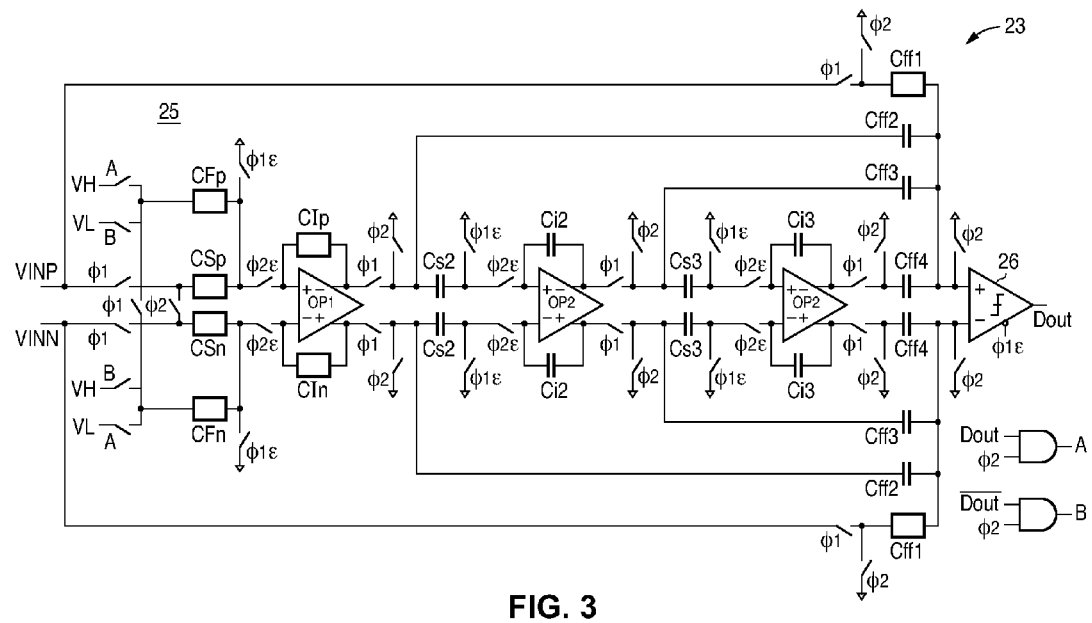
FIG. 3 is a circuit diagram illustrating the circuit (switched-capacitor) implementation of a $3^{rd}$ order incremental ADC according to one embodiment of the present invention.

FIG. 3 is a circuit diagram illustrating the circuit (switched-capacitor) implementation of a $3^{rd}$ order incremental ADC according to one embodiment of the present invention. When the 3rd order modulator 25 in incremental ADC 23 is implemented using CMOS technology, the coefficients X and Y shown in FIG. 2 are realized as ratio of capacitors. The gain "G" of the modulator 25 (and therefore the gain of the ADC) is given as:

$$G = \frac{CSp}{CFp}VINP - \frac{CSn}{CFn}VINN = \frac{CS}{CF}Vin, \quad (2)$$

where CSp=CSn=CS, CFp=CFn=CF and (VINP−VINN)=Vin.

As can be observed from Eq. (2), the gain G of the ΣΔ modulator is defined by the ratio of the sampling capacitor to the feedback capacitor. Therefore, the accuracy of the gain of the ADC is limited by the accuracy of the capacitor ratio of CS to CF. Mismatch in the capacitor units forming the sampling capacitor and the feedback capacitor results in gain error which impacts the accuracy of the analog-to-digital conversion.

Capacitors CSp and CSn are the sampling capacitors and capacitors CFp, CFn are the feedback capacitors of ΣΔ modulator 25 and they are typically formed using variable number of switchable unitary capacitors, such as poly-poly capacitors. The unitary capacitors are formed in a capacitor array, including a one-dimensional array or a two-dimensional array of unitary capacitors. The gain of incremental ADC 23 is programmable by selecting the number of unitary capacitors connected for use by each of the sampling capacitor CS and feedback capacitor CF. For instance, Table 1 below illustrates the number of capacitor units (or unitary capacitors) which can be used to from capacitors CS and CF for different modulator gain settings.

| CSp = CSn | CFp = CFn | Modulator Gain (CS/CF) | Filter Gain | ADC Gain |
|---|---|---|---|---|
| 8 Units | 16 Units | 0.5 | 2 | 1 |
| 12 Units | 12 Units | 1 | 2 | 2 |
| 16 Units | 8 Units | 2 | 2 | 4 |
| 20 Units | 5 Units | 4 | 2 | 8 |

One of the key design specifications of the incremental ADC is the differential input-signal range, which must extend from −Vref/G to +Vref/G, where Vref=VDD and 'G' is the gain of the ADC. To prevent the overloading of the sigma-delta loop, the input signal is attenuated by a suitable factor and hence, in one embodiment, a modulator gain of 0.5 is used and the signal is re-amplified in the digital filter by a gain of 2.

When the capacitance values of sampling capacitor (CS) and feedback capacitor (CF) are changed to change the gain of the ADC, coefficients b1, a1, a2 and a3 will change even though they do not participate in determining the gain of the modulator. To prevent the sigma-delta loop from becoming unstable, coefficients b1, a1, a2 and a3 need to be maintained constant. Accordingly, when the capacitance values of capacitors CS and CF change, the capacitance values for the integrating capacitors CIp, CIn and feed-forward capacitor Cff1 need to be changed accordingly. In actual implementations, the integrating capacitors and the feedforward capacitors are also formed by variable number of switchable unitary capacitors.

The gain accuracy of the incremental ADC 23 is mainly determined by the accuracy of the capacitor ratio of the sampling capacitor to feedback capacitor (CS/CF). Thus, accurate capacitance ratios are needed to preserve the high gain accuracy and symmetry property of the differential structure of the modulator. That is, both CSp/CFp and CSn/CFn ratios should be accurate to ensure high gain accuracy.

Source of Component Mismatch Error

When the ΣΔ modulator is fabricated using CMOS technology, it is often difficult to achieve the required high gain accuracy necessary for high resolution converters due to fabrication-induced errors. The most important error sources concern the capacitor design and capacitor mismatches in the CMOS integrated circuit as a result of the fabrication process. As discussed above, capacitor mismatch errors lead to gain error of the ADC as the gain of the ADC is a function of a ratio of two capacitors. The types of fabrication-induced error include random errors and systematic errors.

1. Random Errors

Random errors are one type of fabrication errors which can lead to capacitor mismatches. Random errors can be grouped into peripheral fluctuations and areal fluctuations. Peripheral fluctuations affect the perimeter of a surface, for example a polysilicon area, and may cause irregularities at the edge. Areal fluctuations are random variations in the thickness of layers in the integrated circuit. For example, the silicon oxide thickness between two polysilicon plates and the thickness of the polysilicon plates themselves may have variations.

It has been shown that component mismatch due to random errors can be minimized by using larger unitary capacitors. In one exemplary CMOS technology, random mismatch between two equal capacitors is given by:

$$\text{Mismatch }(\sigma) = \frac{0.35}{\sqrt{W*L}}\%, \quad (3)$$

where W*L is the polysilicon surface area of the capacitor.

Figure 4:
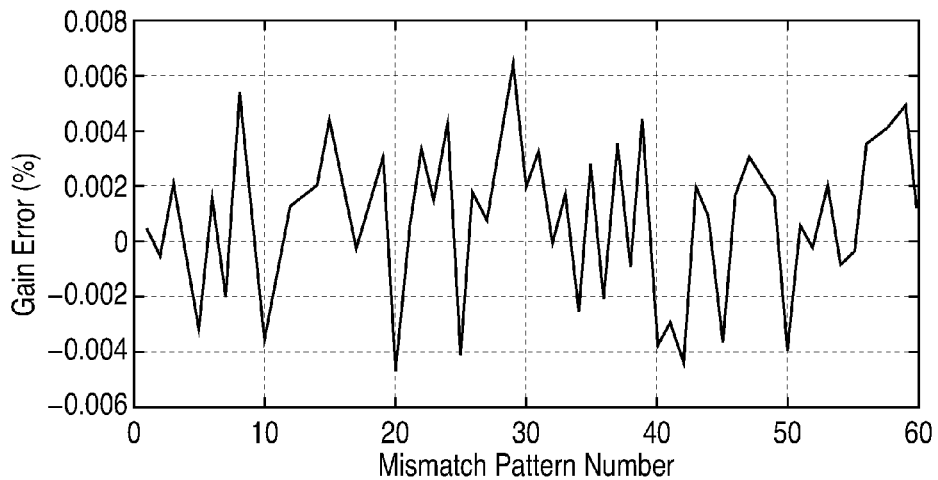
FIG. 4 is a graph illustrating the part to part gain error of an incremental ADC where the gain error is due only to random errors in the capacitor elements.

FIG. 4 is a graph illustrating the part to part gain error of an incremental ADC where the gain error is due only to random errors in the capacitor elements.

2. Systematic Errors

Systematic errors are another type of fabrication errors which can lead to capacitor mismatches. Systematic errors that contribute to mismatch in capacitors ratios include oxide thickness gradient on a die surface, package stress, etch rate variations due to surrounding geometries, thermal gradients during the operation of the chip and unmatched interconnection capacitances in the layout. Common-centroid layout, dynamic element matching and digital calibration are some of the conventional techniques employed to remove component mismatch due to systematic errors.

Figure 5A:
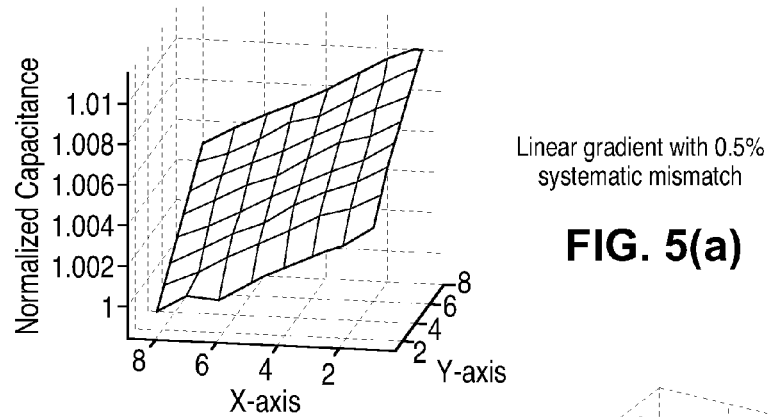
FIG. 5(a) is a graphical representation of the distribution in capacitance value due to linear gradient in oxide thickness and FIG. 5(b) is a graphical representation of the distribution in capacitance value due to annular gradient in oxide thickness.
Figure 5B:
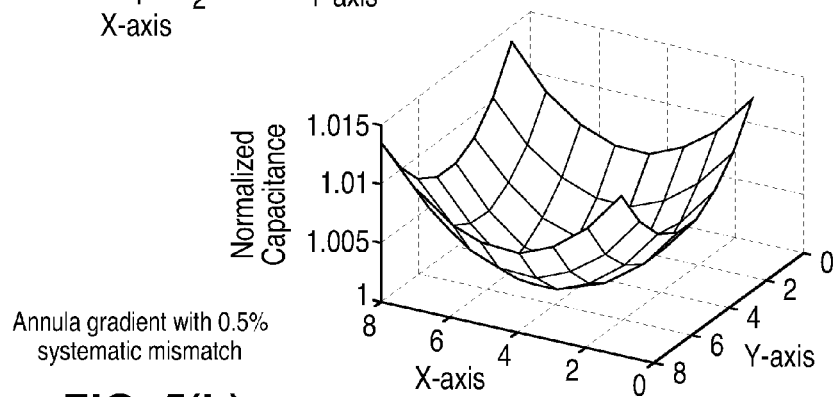

Oxide thickness gradients can be linear or angle dependent and the effect of linear or annular gradient on the gain of the ADC is different. In one example, an ADC gain of 1 and the presence of 0.5% mismatch in capacitor values due to different gradients in oxide thickness is analyzed. FIG. 5(a) is a graphical representation of the distribution in capacitance value due to linear gradient in oxide thickness and FIG. 5(b) is a graphical representation of the distribution in capacitance value due to annular gradient in oxide thickness. Simulation results show that the gain error due to linear gradient is 0.011% while the gain error due to annular gradient is 0.017%. The effects of linear oxide thickness gradients are inherently canceled when common centroid layout is used. However, angle-dependent gradients cannot be eliminated through a simple common centroid layout.

Capacitor Rotation Method

Figure 6:
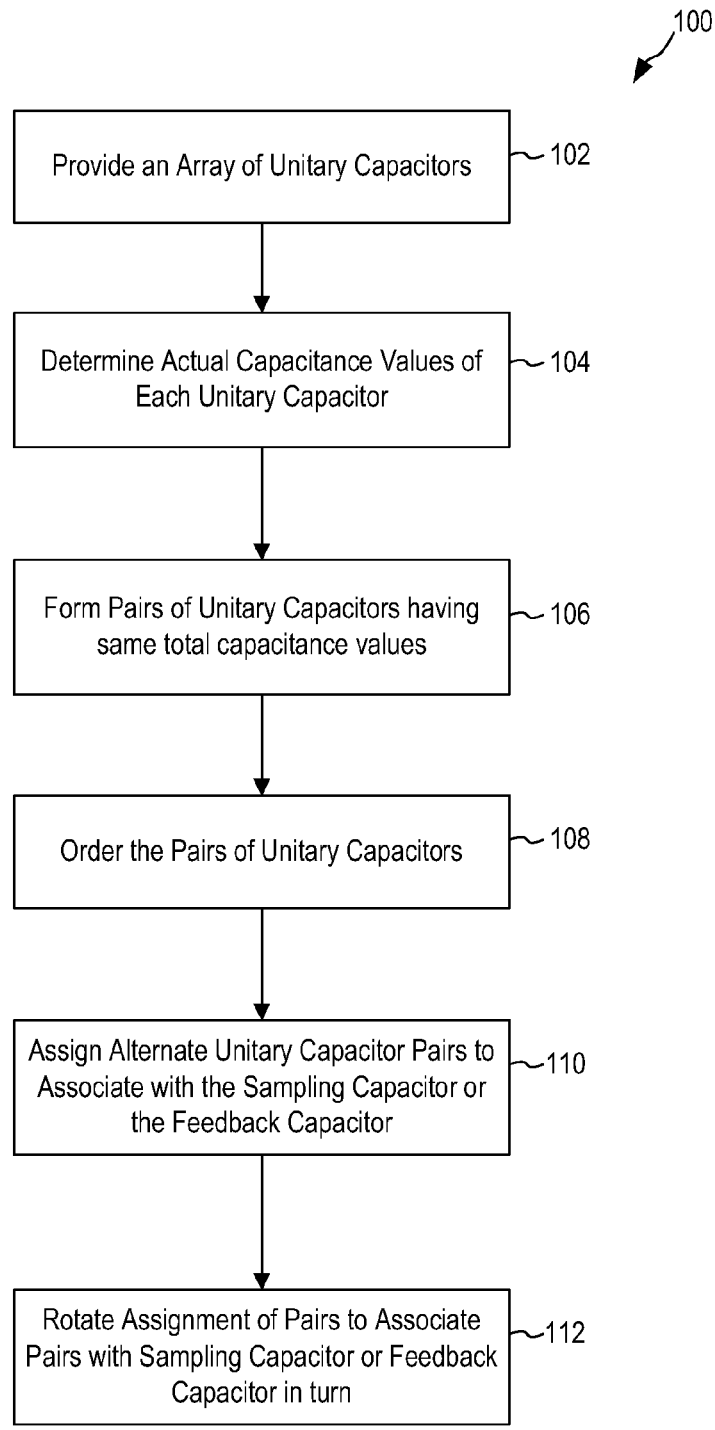
FIG. 6 is a flow chart illustrating the capacitor rotation method according to one embodiment of the present invention.

In accordance with one embodiment of the present invention, a capacitor rotation method is implemented in the sigma-delta modulator of an incremental ADC to eliminate capacitor mismatch errors, thereby improving gain accuracy of the ADC. FIG. 6 is a flow chart illustrating the capacitor rotation method according to one embodiment of the present invention. Referring to FIG. 6, capacitor rotation method 100 operates in three phases for balancing the capacitance values of unit capacitors in an array where the unit capacitors are used to form the sampling and feedback capacitors of an incremental ADC. The first phase involves equalizing the capacitance values by forming capacitor pairs. The second phase involves selecting capacitor pairs to form groups to be associated with each of the sampling and feedback capacitors. The third phase involves rotating the capacitor pairs for each group to balance the capacitor errors.

Figure 7A:
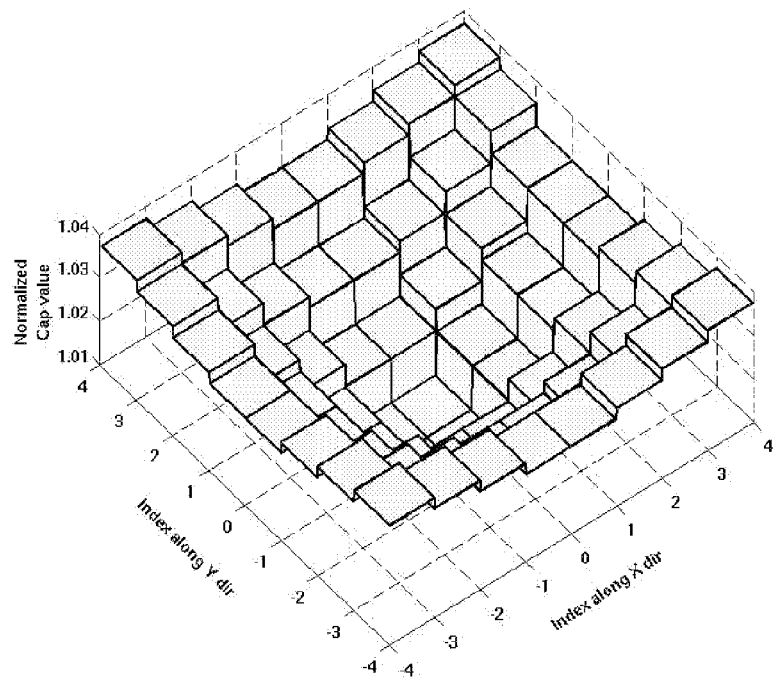
FIG. 7(a) illustrates the capacitance value profile indicative of a systematic annular gradient of capacitance values for a capacitor array with a common centroid layout.

The capacitor rotation method 100 will now be described in more detail. In the first phase, the unitary capacitors are paired to derive capacitor pairs having the same or about the same capacitance values. More specifically, at step 102, an array of unitary capacitors is provided. Each of the unitary capacitors are designed to have the same capacitance value. The array can be a one-dimensional array or a two-dimensional array. Typically, the array of unitary capacitors are formed using a common centroid layout to remove capacitor mismatch errors due to systematic errors. At step 104, the actual capacitance value of each unitary capacitor is determined. The actual capacitance values can be determined through physical measurements of the unitary capacitors in the array. Alternately, the actual capacitance values can be determined using modeling based on an assumed profile of the distribution of the actual capacitance values in the array. For example, when the capacitor array has a common centroid layout, the capacitance values can have a systematic annular gradient as the assumed profile, as shown in FIG. 7(a). Referring to FIG. 7(a), in a common centroid layout, the capacitance values of the unitary capacitors in the array often assume an annular gradient profile where the capacitance values in the center or inner core of the centroid tend to be less than the capacitance values at the periphery of the centroid, leading to capacitance value mismatch.

After the actual capacitance values are determined, capacitor rotation method 100 proceeds to form pairs of unitary capacitors where the pairs having the same or about the same total capacitance values (step 106). That is, pairs of unitary capacitors are selected from the array based on their actual capacitance values so that each pair has the same or approximately the same total capacitance value. In one embodiment, the pairing of the unitary capacitors is carried out using min-max pairing. That is, the actual capacitance values of the unitary capacitor are ordered from the minimum value to the maximum value. A first pair is formed using a unitary capacitor with the smallest capacitance value and a unitary capacitance with the largest capacitance value. The next pair is formed using a unitary capacitor with the next smallest capacitance value and a unitary capacitor with the next largest capacitance value and so on until all the unitary capacitors have been matched up. After the unitary capacitors are paired up, they operate as a single unit.

Figure 7B:
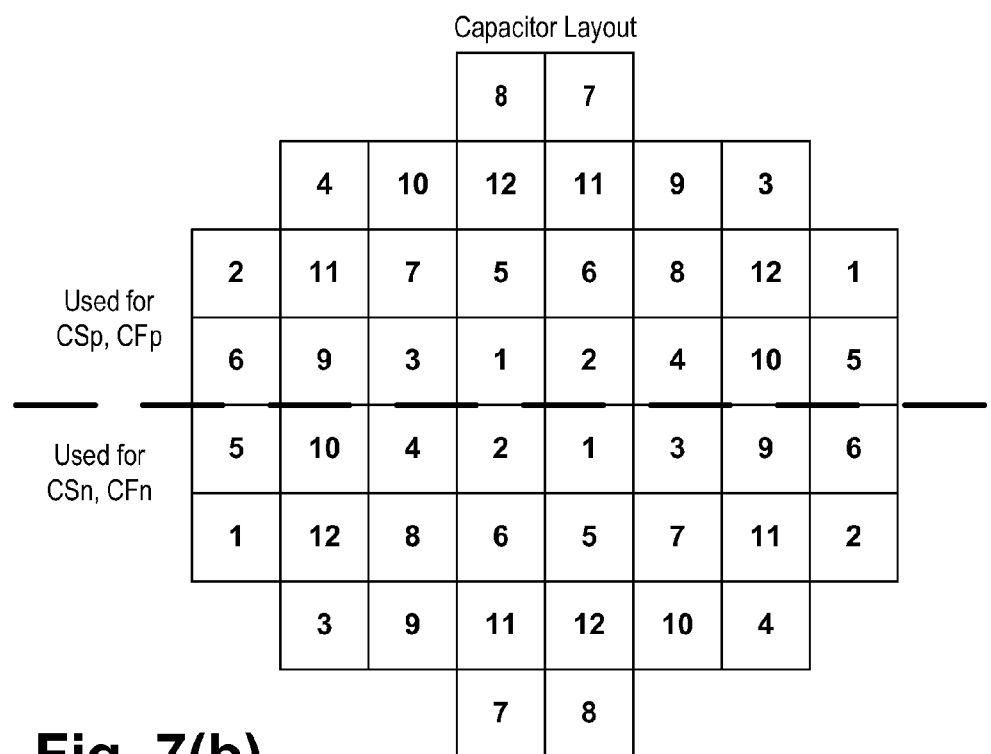
FIG. 7(b) illustrates one embodiment of the pairing of the unitary capacitors in the capacitor array of FIG. 7(a).

FIG. 7(b) illustrates one embodiment of the pairing of the unitary capacitors in the capacitor array of FIG. 7(a). Referring to FIG. 7(b), each box in the array denotes one unitary capacitor and the number in each box denotes the pairing of the unitary capacitors. In the embodiment shown in FIG. 7(b) the capacitor array is applied in a differential-input ADC and therefore, the capacitor array is divided in half with the top half being used for the sampling/feedback capacitors of the positive signal path (CSp and CFp) and the bottom half being used for the sampling/feedback capacitors of the negative signal path (CSn and CFn). In the differential-input application, the pairing of the unitary capacitors for each set of sampling/feedback capacitors take place from the respective half of the capacitor array. In a single-ended application, the pairing of the unitary capacitors for the sampling/feedback capacitors can take place from all of the unitary capacitors in the array.

As shown in FIG. 7(b), a first pair ("1") of unitary capacitors is formed by taking a unitary capacitor in the inner core of the array with lower capacitance values and a unitary capacitor at the periphery of the array with higher capacitance values. A second pair ("2") is formed accordingly and so on. The pairing of the unitary capacitors has the effect of equalizing the capacitance mismatch among the unitary capacitors in the array. In the pairing operation, it is not necessary to form pairs of unitary capacitors with exactly the same total capacitance values. It is only critical that the total capacitance values of the pairs are balanced out among the pairs as much as possible by matching unitary capacitors with large capacitance values with unitary capacitors with small capacitance values. When unitary capacitors with large or small capacitance values are matched, then capacitors with only moderate mismatch capacitance values (in the middle of the range) can be paired up. When the unitary capacitors are paired up as such, there will be certain amount of residual imbalance in the total capacitance values. The residual imbalance in the total capacitance values of the pairs of unitary capacitors will be balanced out in the next phase of the capacitor rotation method.

Figure 8:
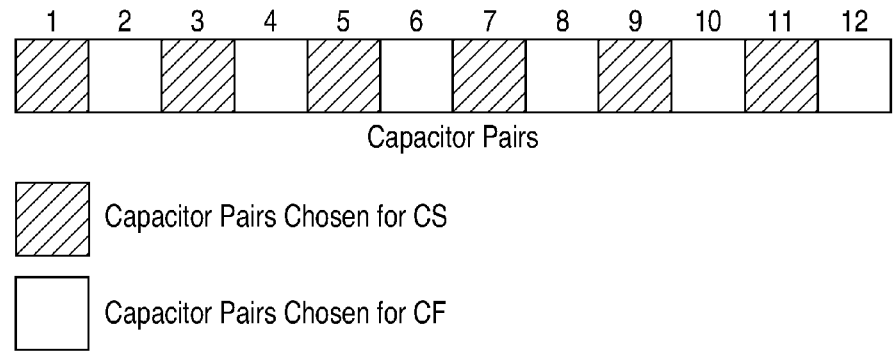
FIG. 8 illustrates alternate unitary capacitor pairs being assigned to a first group and a second group to be associated with one of the sampling capacitor and feedback capacitor.

Proceeding to the second phase of capacitor rotation method 100, the pairs of unitary capacitors are ordered (step 108) and alternate unitary capacitor pairs are assigned to be associated with the sampling capacitor or the feedback capacitor (step 110), as shown in FIG. 8. By selecting alternate unitary capacitor pairs for each capacitor, the residual imbalance in total capacitance value of the capacitor pairs is distributed and better balance in capacitance values is achieved. The sizes of the sampling capacitor and the feedback capacitor are dependent on the gain of the modulator or ADC. Therefore, the sampling capacitor and feedback capacitor may not always be formed using the same number of unitary capacitors. That is, the sampling capacitor may be associated with a first number of unitary capacitor pairs and the feedback capacitor may be associated with a second number of unitary capacitor pairs, the first number and the second number being the same or different. In the case where more unitary capacitor pairs are used for the feedback capacitor than the sampling capacitor, the second number of unitary capacitor pairs for the feedback capacitor includes pairs that are alternating with the first number of unitary capacitor pairs and pairs that are consecutive.

Finally, in the third phase of the capacitor rotation method, the assignment of unitary capacitor pairs are rotated at a certain rotation frequency so that each unitary capacitor pair is associated with each of the sampling capacitor and the feedback capacitor in turn (step 112). That is, at the first rotation, capacitor pairs 1, 3, 5 and on (FIG. 8) are first associated with the sampling capacitor and capacitor pairs 2, 4, 6 and on (FIG. 8) are first associated with the feedback capacitor. Then, the assignment are rotated so that capacitor pairs 1, 3, 5 and on are now associated with the feedback capacitor and capacitor pairs 2, 4, 6 and on are now associated with the sampling capacitor. The rotation continues by associating the odd pairs back again with the sampling capacitor and the even pairs with the feedback capacitor. By rotating the pair assignment at a certain frequency, any residual capacitor value imbalance will be averaged out between the two capacitors and the ratio of the sampling and feedback capacitors can match exactly to provide the desired gain accuracy.

Figure 9:
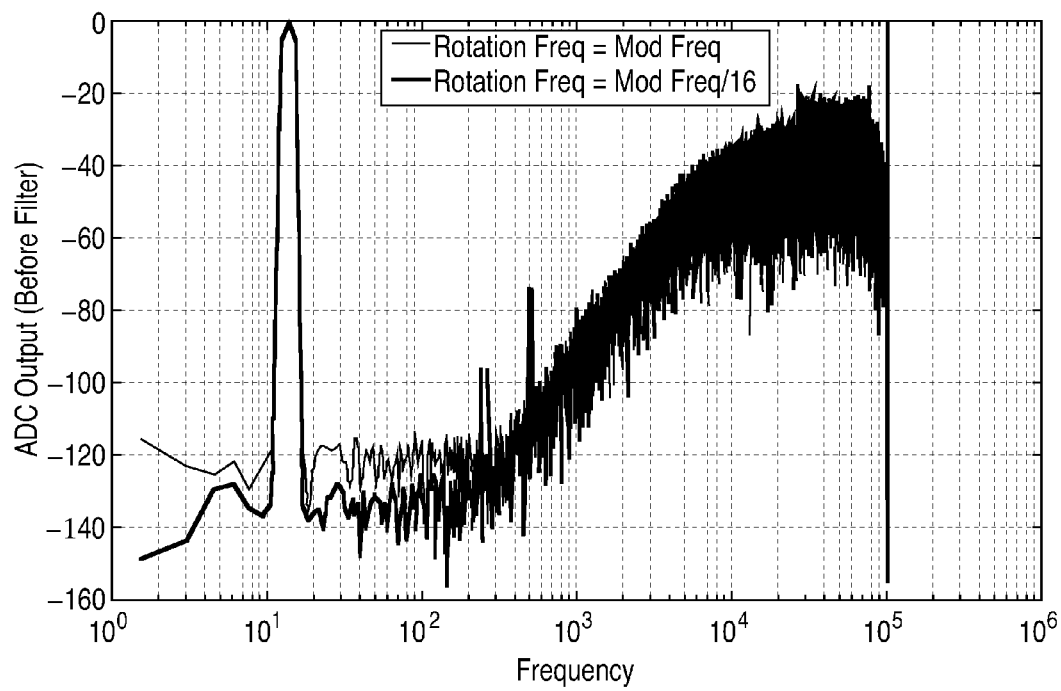
FIG. 9 is a plot illustrating the effect of the capacitor rotation frequency on the noise floor of ADC.

The capacitor rotation method operates to convert the gain error due to capacitor mismatch into higher frequency components. However, in an incremental ADC, these higher frequency components can interact with high frequency noise components of the sigma-delta loop and modulate the high-frequency noise back to baseband, thus deteriorating the resolution of the ADC. The effect of the capacitor rotation frequency on the noise floor of ADC can be observed in FIG. 9. As shown in FIG. 9, when the frequency for the capacitor pair rotation is set at 1/16th of the modulator frequency, better signal-to-noise ration (SNR) is obtained. Hence, the frequency of rotation should be chosen appropriately to avoid injecting noise into the noise floor.

In one embodiment, a rotation frequency that is 1/16th of the modulator frequency is used. Reducing the rotation frequency further brings the tones introduced because of rotation back into the baseband. Choosing a rotation frequency 1/16th of modulator frequency ensures that these extra tones fall exactly at the notches of the digital filter. In one embodiment, the rotation frequency should be distant from the modulation frequency. For example, the rotation frequency is $$\frac{f_{CLK}}{\sqrt{OSR}}$$

where $f_{CLK}$ a frequency being used by the integrated circuit in normal operation and OSR is the over-sampling ratio of the ADC. Furthermore, the rotation frequency can be rounded off to a square of two in another embodiment.

FIG. 10 is a capacitor rotation table of twelve pairs of unitary capacitors being assigned for use with a sampling capacitor and a feedback capacitor for ADC gain=1. In the illustration in FIG. 10, the modulator is assumed to have a gain of 0.5 and therefore the sampling capacitor CS to feedback capacitor CF ratio is 0.5. That is, the capacitance value for the sampling capacitor CS is one half of the capacitance value for the feedback capacitor CF. Referring to FIG. 10, the twelve pairs of unitary capacitor pairs are divided such that four capacitor pairs are chosen for capacitor CS and eight capacitor pairs are chosen for capacitor CF. During the first rotation cycle, the first eight pairs (numbers 5-12) are alternately assigned to capacitor CS (denoted "1") and capacitor CF (denoted "0") and the last four pairs (numbers 1-4) are all assigned to capacitor CF. That is, capacitor pairs 12, 10, 8, 6 together form sampling capacitor CS and the rest of the capacitor pairs are used to form feedback capacitor CF. At the second rotation cycle, the assignment of the capacitor pairs is rotated. That is, the capacitor pairs assigned to capacitor CS is now shifted to the left once and capacitor pairs 11, 9, 7 and 1 are now assigned to capacitor CS and the remaining pairs assigned to capacitor CF. At the third rotation cycle, the assignment of the capacitor pairs is rotated again. Now, the capacitor pairs assigned to capacitor CS is now shifted to the left once more and capacitors 12, 10, 8 and 2 are now assigned to capacitor CS and the remaining pairs assigned to capacitor CF. The rotation go on and the assignment sequence repeats every 12 cycles. Hence, rotation cycle 13 is same as rotation cycle 1.

FIG. 11 is a second capacitor rotation table of twelve pairs of unitary capacitors being assigned for use with a sampling capacitor and a feedback capacitor for ADC gain=2. In the illustration in FIG. 11, the modulator is assumed to have a gain of 1 and therefore the sampling capacitor CS to feedback capacitor CF ratio is 1. That is, the sampling capacitor CS and the feedback capacitor CF have the same capacitance values. Referring to FIG. 11, six capacitor pairs are assigned to each of capacitor CS and capacitor CF at every rotation clock cycle. When the capacitor pairs are evenly divided, there are only two combinations possible wherein all the odd numbered capacitor pairs form capacitor CS and all even numbered capacitor pairs form capacitor CF and vice versa. Thus, the rotation sequence repeats every 2 cycles and rotation cycle 3 is same as rotation cycle 1.

Figure 12:
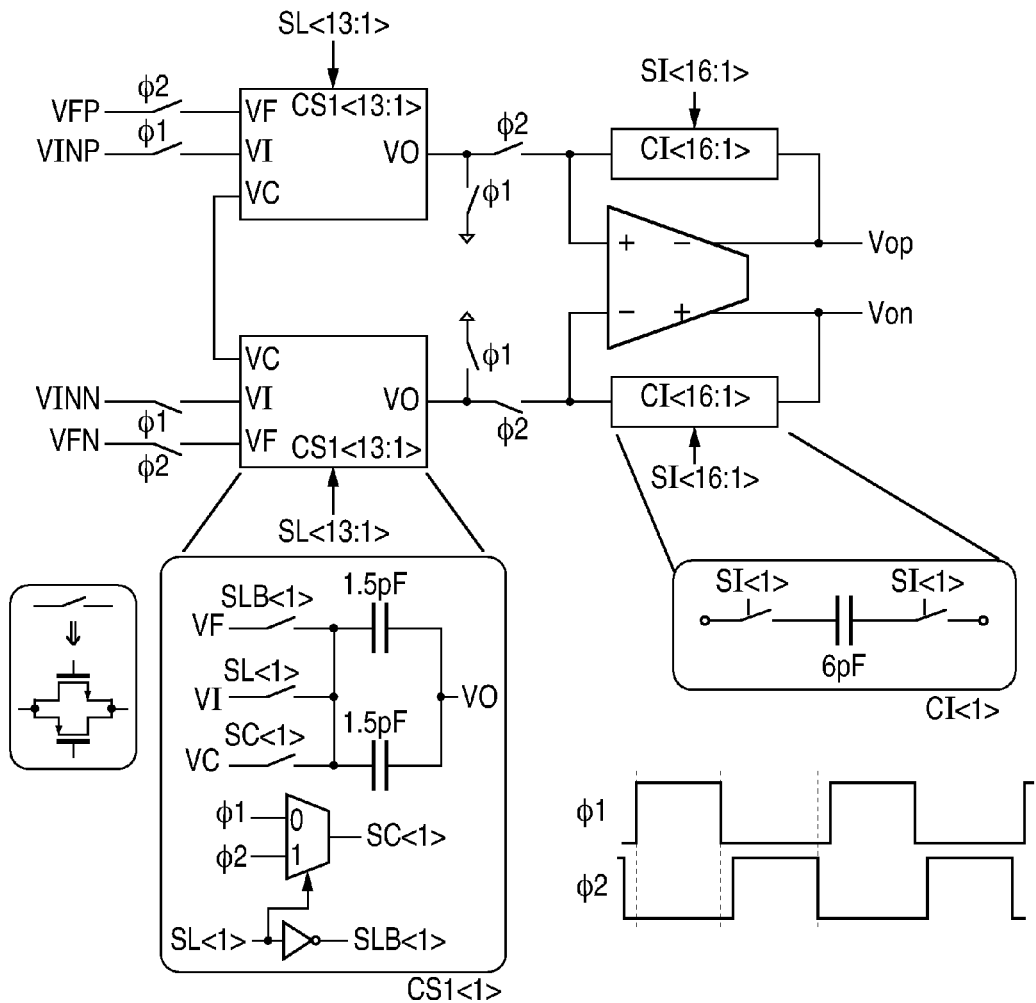
FIG. 12 is a schematic diagram of a circuit which can be used to implement the capacitor rotation method according to one embodiment of the present invention.
Figure 13:
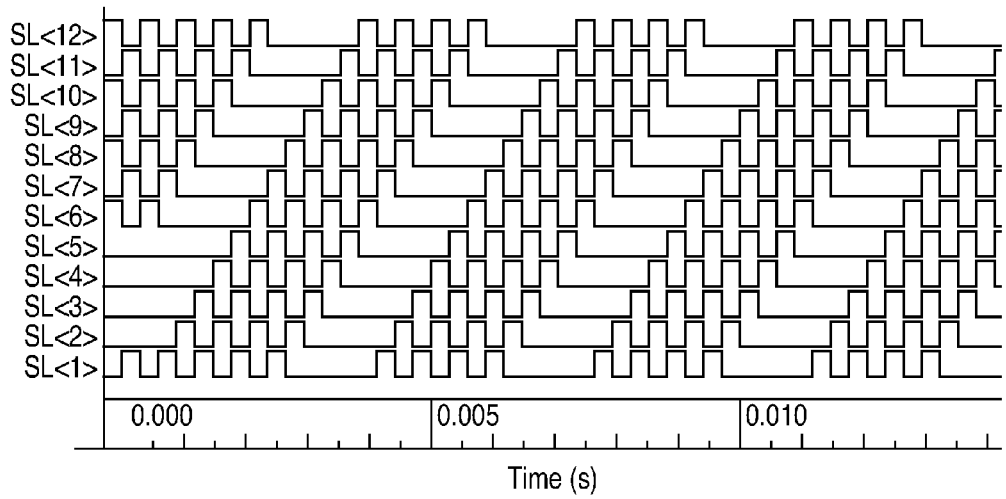
FIG. 13 illustrates the select signals generated in case of a modulator gain of '0.5' for use in the switchable capacitor array according to one embodiment of the present invention.

FIG. 12 is a schematic diagram of a circuit which can be used to implement the capacitor rotation method according to one embodiment of the present invention. Referring to FIG. 12, the programmable gain of the ADC is realized using switchable capacitor array "CS1<13:1>". Each block (CS1<1> to CS1<13>) contains a unitary capacitor pair as selected by the min-max pairing in the capacitor rotation method. Each block contains three transmission gate switches controlled by a select signal SL and a pair of capacitors formed according to step 106 (FIG. 6). Each block (CS1) will act as either the input capacitor or the feedback capacitor based on the value of the select signal SL. If the select signal SL<1> is high, then capacitor pair CS<1> will be connected to the input node VI and if select signal SL<1> is low, then capacitor pair CS<1> will be connected to the feedback node VF. Choosing alternate capacitor pairs and rotation of the capacitor pairs are realized by controlling the select signals SL<13:1> which are generated from a digital controller. The select signals generated in case of a modulator gain of '0.5' are shown in FIG. 13.

Returning to FIG. 12, integrating capacitor array CI<16:1> determines the stability of the ADC. The total value of integrating capacitor is controlled by control signals SI<16:1>. As the value of input capacitor and feedback capacitor vary with the gain setting of the ADC, in order to ensure stability of the ADC, the value of integrating capacitor is varied accordingly by controlling the signal SI<16:1>.

Figure 15:
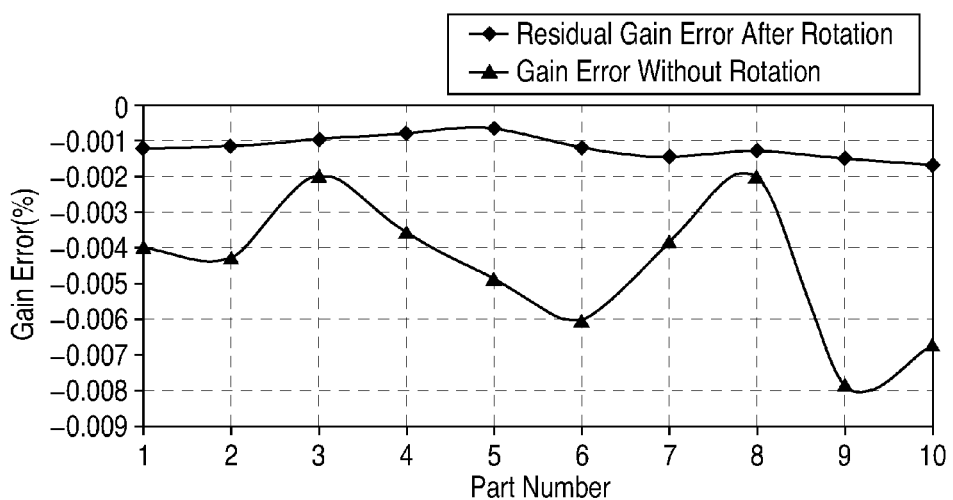
FIG. 15 shows the testing results of 10 parts illustrating the effectiveness of the capacitor rotation method in removing part-to-part variation in gain error.

FIGS. 14(*a*) and 14(*b*) are simulation results of gain error of an ADC with and without the capacitor rotation method implemented for an assumed capacitor profile. For the simulation result of FIGS. 14(*a*) and (*b*), systematic error with annular profile is introduced into the capacitor array used to form capacitors CS and CF. As can be observed from a comparison of FIG. 14(*b*) to FIG. 14(*a*), rotating the capacitors in the capacitor array according to the capacitor rotation method of the present invention reduces the gain error introduced by the systematic error in the capacitors. For instance, in FIG. 14(*a*), the gain error without capacitor rotation applied is 0.015% and in FIG. 14(*b*), the gain error with capacitor rotation applied is 1.76e-4%. FIG. 15 shows the testing results of 10 parts illustrating the effectiveness of the capacitor rotation method in removing part-to-part variation in gain error.

According to another aspect of the present invention, the capacitor rotation method of the present invention is applied to rotate three or more capacitors where the system parameter is determined by the combination of two capacitor ratioed with a third capacitor. For instance, the sampling capacitor may be connected in parallel with an auxiliary capacitor $C_A$. In that case, the sampling capacitor CS, the auxiliary capacitor $C_A$ and the feedback capacitor CF can all be assigned to alternate unitary capacitor pairs in a capacitor array and the assignment is rotated in accordance with the capacitor rotation method of the present invention to achieve balancing between all three capacitors.

The above detailed descriptions are provided to illustrate specific embodiments of the present invention and are not intended to be limiting. Numerous modifications and variations within the scope of the present invention are possible. The present invention is defined by the appended claims.

We claim:

1. A method for removing component mismatch errors for a system parameter being set by a ratio of two or more physical, electrical components ("components") of the same kind on an integrated circuit, the method comprising:

providing an array of component units on the integrated circuit, each component unit being designed to have the same component value;

determining the actual component values of each component unit in the array;

selecting component units based on the actual component values to form pairs of component units ("component unit pairs"), the pairs having approximately the same total component values;

ordering the component unit pairs into an order of component unit pairs;

assigning alternate component unit pairs to be associated with each of the two or more components; and rotating at a first frequency the assignment of the component unit pairs associated with each of the two or more components, wherein at each rotation, the component unit pairs to be associated with each component are shifted along the order of the component unit pairs so that each component unit pair is associated with a different one of the two or more physical, electrical components in turn.

2. The method of claim 1, wherein providing the array of component units on the integrated circuit comprises providing a two dimensional array of component units on the integrated circuit.

3. The method of claim 2, wherein providing the two dimensional array of component units on the integrated circuit comprises providing a two dimensional array of component units having a common-centroid layout on the integrated circuit.

4. The method of claim 1, wherein determining the actual component values of each component unit in the array comprises determining the actual component values of each component unit in the array using physical measurements.

5. The method of claim 1, wherein determining the actual component values of each component unit in the array comprises determining the actual component values of each component unit in the array using modeling based on an assumed profile of the distribution of the actual component values in the array.

6. The method of claim 5, wherein the array of component units on the integrated circuit comprises a two dimensional array of component units and the assumed profile of the distribution of the actual component values in the array comprises an annular profile for the distribution of the actual component values in the two dimensional array.

7. The method of claim 1, wherein selecting component units based on the actual component values to form pairs of component units comprises:

selecting component units to form pairs of component units using min-max pairing, wherein a first pair of component units is formed using a component unit having the lowest actual component value and a component unit having the largest actual component value, and the next pair of component units is formed using a component unit with the next lowest actual component value and a component unit with the next largest actual component value and so on.

8. The method of claim 1, wherein assigning alternate component unit pairs to be associated with each of the two or more components comprises:

assigning a first number of alternate component unit pairs to a first component; and assigning a second number of component unit pairs to a second component, the second number of component unit pairs including component unit pairs that are alternating with the first number of alternate component unit pairs and component unit pairs that are consecutive, the second number being greater than the first number.

9. The method of claim 1, wherein the first frequency comprises a frequency distant from a frequency being used by the integrated circuit in normal operation.

10. The method of claim 9, wherein the first frequency comprises a frequency that is $$\frac{f_{CLK}}{\sqrt{OSR}}$$

where $f_{CLK}$ a frequency being used by the integrated circuit in normal operation and OSR is the over-sampling ratio of the integrated circuit.

11. The method of claim 9, wherein the first frequency comprises a frequency that is a square-root of a frequency being used by the integrated circuit in normal operation and rounded off to a square of two.

12. The method of claim 9, wherein the integrated circuit comprises an analog-to-digital converter incorporating a sigma-delta modulator and the two or more components comprises a sample capacitor and a feedback capacitor of the sigma-delta modulator and the first frequency comprises a frequency distant from a sampling frequency of the sigma-delta modulator.

13. The method of claim 1, wherein the two or more components comprise capacitors and the array of the component units comprises an array of unitary capacitors being designed to have the same capacitance value.

14. The method of claim 1, wherein the two or more components comprise components selected from capacitors, resistors, and inductors.

15. A method for removing gain error caused by capacitor mismatch in an analog-to-digital converter (ADC) incorporating a sigma-delta modulator formed on an integrated circuit, the gain of the ADC being set by a ratio of a sampling capacitor to a feedback capacitor, the method comprising:
    providing an array of unitary capacitors on the integrated circuit, each unitary capacitor being designed to have the same capacitance value;
    determining the actual capacitance values of each unitary capacitor in the array;
    selecting unitary capacitors based on the actual capacitance values to form pairs of unitary capacitors ("unitary capacitor pairs"), the pairs having approximately the same total capacitance values;
    ordering the unitary capacitor pairs into an order of unitary capacitor pairs;
    assigning alternate unitary capacitor pairs to be associated with one of the sampling capacitor and feedback capacitor; and
    rotating at a first frequency the assignment of the unitary capacitor pairs associated with each of the sampling and feedback capacitors, wherein at each rotation, the unitary capacitor pairs to be associated with each of sampling and feedback capacitors are shifted along the order of the unitary capacitor pairs so that each unitary capacitor pair is associated with a different one of the sampling and feedback capacitors in turn.

16. The method of claim 15, wherein the ADC comprises a differential input ADC and the gain of the ADC comprises a first gain being set by a ratio of a first sampling capacitor to a first feedback capacitor and a second gain being set by a ratio of a second sampling capacitor to a second feedback capacitor, the method further comprising:
    dividing the array of unitary capacitors into a first half and a second half, the unitary capacitor pairs in the first half of the array being associated with the first sampling capacitor and the first feedback capacitor and the unitary capacitor pairs in the second half of the array being associated with the second sampling capacitor and the second feedback capacitor.

17. The method of claim 15, wherein providing an array of unitary capacitors on the integrated circuit comprises providing a two dimensional array of unitary capacitors having a common-centroid layout on the integrated circuit.

18. The method of claim 15, wherein determining the actual capacitance values of each unitary capacitor in the array comprises determining the actual capacitance values of each unitary capacitor in the array using modeling based on an assumed profile of the distribution of the actual capacitance values in the array.

19. The method of claim 18, wherein the assumed profile of the distribution of the actual capacitance values in the array comprises an annular profile for the distribution of the actual capacitance values in the two dimensional array.

20. The method of claim 15, wherein selecting unitary capacitors based on the actual capacitance values to form pairs of unitary capacitors comprises:
    selecting unitary capacitors to form pairs of unitary capacitors using min-max pairing, wherein a first pair of unitary capacitors is formed using the a unitary capacitor having the lowest actual capacitance value and a unitary capacitor having the largest actual capacitance value, and the next pair of unitary capacitors is formed using a unitary capacitor with the next lowest actual capacitance value and a unitary capacitor with the next largest actual capacitance value and so on.

21. The method of claim 15, wherein assigning alternate unitary capacitor pairs to be associated with one of the sampling capacitor and feedback capacitor comprises:
    assigning a first number of alternate unitary capacitor pairs to one of the sample and feedback capacitor; and
    assigning a second number of unitary capacitor pairs to the other one of the sample and feedback capacitor, the second number of unitary capacitor pairs including unitary capacitor pairs that are alternating with the first number of alternate unitary capacitor pairs and unitary capacitor pairs that are consecutive, the second number being greater than the first number.

22. The method of claim 15, wherein the first frequency comprises a frequency distant from a sampling frequency of the sigma-delta modulator.

23. The method of claim 22, wherein the first frequency comprises a frequency that is $$\frac{f_{CLK}}{\sqrt{OSR}}$$

where $f_{CLK}$ a frequency being used by the integrated circuit in normal operation and OSR is the over-sampling ratio of the ADC.

24. The method of claim 22, wherein the first frequency comprises a frequency that is a square-root of the sampling frequency of the sigma-delta modulator and rounded off to a square of two.

* * * * *